(12) United States Patent
Lyons et al.

(10) Patent No.: US 7,056,804 B1
(45) Date of Patent: Jun. 6, 2006

(54) SHALLOW TRENCH ISOLATION POLISH STOP LAYER FOR REDUCED TOPOGRAPHY

(75) Inventors: Christopher F. Lyons, Fremont, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 134 days.

(21) Appl. No.: 10/790,366

(22) Filed: Mar. 1, 2004

(51) Int. Cl.
*H01L 21/76* (2006.01)

(52) U.S. Cl. .................................... 438/424

(58) Field of Classification Search .............. 438/424, 438/427
See application file for complete search history.

(56) References Cited

U.S. PATENT DOCUMENTS

| 5,130,268 A | * | 7/1992 | Liou et al. ............... 438/425 |
| 5,346,584 A | * | 9/1994 | Nasr et al. ............... 438/427 |
| 5,578,518 A | * | 11/1996 | Koike et al. ............... 438/424 |
| 5,786,262 A | * | 7/1998 | Jang et al. ............... 438/424 |
| 5,817,568 A | * | 10/1998 | Chao ............... 438/427 |
| 5,837,612 A | * | 11/1998 | Ajuria et al. ............... 438/697 |
| 5,930,645 A | * | 7/1999 | Lyons et al. ............... 438/424 |
| 6,001,706 A | * | 12/1999 | Tan et al. ............... 438/424 |
| 6,423,612 B1 | | 7/2002 | Yang et al. ............... 438/424 |
| 6,555,476 B1 | * | 4/2003 | Olsen et al. ............... 438/692 |

* cited by examiner

*Primary Examiner*—David S. Blum
(74) *Attorney, Agent, or Firm*—Renner, Otto, Boisselle & Sklar, LLP

(57) ABSTRACT

A method of making and shallow trench isolation feature including 1) providing a semiconductor substrate, 2) forming a polish stop layer over the semiconductor substrate, 3) forming a nitride containing layer over the polish stop layer, 4) forming a shallow trench layer through a portion of the nitride containing layer, a portion of the polish stop layer and a portion of the semiconductor substrate, 5) removing the nitride containing layer by a chemical mechanical polishing process, and 6) planarizing the shallow trench layer and the polish stop layer until a surface of the shallow trench layer and a surface of the polish stop layer are co-planar.

14 Claims, 2 Drawing Sheets

SHALLOW TRENCH ISOLATION POLISH STOP LAYER FOR REDUCED TOPOGRAPHY

TECHNICAL FIELD

The present invention generally relates to shallow trench isolation (STI) features used to electrically isolate semiconductor devices. In particular, the present invention relates to an STI polish stop layer for reduced topography.

BACKGROUND

A pervasive trend in modern integrated circuit manufacture is to produce semiconductor devices, e.g., FETs, having feature sizes as small as possible. Many present processes employ features, such as gate electrodes and interconnects, which have less than a 0.18 µm critical dimension. As feature sizes continue to decrease, the size of the resulting semiconductor device, as well as the interconnect between semiconductor devices, also decreases. Fabrication of smaller semiconductor devices allows more semiconductor devices to be placed on a single monolithic semiconductor substrate, thereby allowing relatively large circuit systems to be incorporated on a single, relatively small die area. In some cases, these semiconductor devices are electrically isolated from each other by an STI feature.

A conventional STI feature is fabricated by forming a barrier oxide layer of $SiO_2$ over a semiconductor substrate. Next, a nitride layer is formed over the barrier oxide layer. Then, apertures are formed in the nitride layer and the barrier layer to expose a surface of the semiconductor substrate. Following the formation of a shallow trench in the surface of the semiconductor substrate, an oxide deposition is performed. The oxide deposition process forms a field oxide layer (trench oxide) that fills the shallow trench and apertures. In some cases, a liner oxide layer is formed interposed between the trench oxide and the semiconductor substrate. Finally, the nitride layer is stripped from the barrier oxide layer with one or more suitable stripping agents. As a result, a portion of the STI feature is left proud of the barrier oxide layer. That is, an undesirable step is formed between the STI feature and the barrier oxide layer. The step contributes to undesirable thickness variations in the surface topography of layers formed subsequently. The thickness variations can affect the characteristics of the subsequently formed layers For example, a photoresist layer used in a photolithography process to form precise lines is adversely affected by the topography of the surface. Likewise, the characteristics of an anti-reflective coating (ARC) layer are degraded by significant changes in thickness of the ARC layer. Accordingly, the operability of the device is adversely affected. Further, the reliability and lifetime of the semiconductor device may be degraded. Additionally, the thickness variations may require additional process steps to be accomplished to ensure the semiconductor device is operating within design specifications.

Therefore, a need exists for a method which will produce an STI feature including a surface that is co-planar with an adjacent surface. That is, there is a need for a method that significantly reduces thickness variations in a surface topography of an intermediate semiconductor structure.

SUMMARY OF THE INVENTION

According to one aspect of the invention, the invention is a method of fabricating a shallow trench isolation feature including the steps of: providing a semiconductor substrate, forming a polish stop layer over the semiconductor substrate, forming a nitride containing layer over the polish stop layer, forming a shallow trench layer through a portion of the nitride containing layer, a portion of the polish stop layer and a portion of the semiconductor substrate, removing the nitride containing layer by a chemical mechanical polishing process and planarizing the shallow trench layer and the polish stop layer until a surface of the shallow trench layer and a surface of the polish stop layer are co-planar.

According to another aspect of the invention, the invention is a shallow trench isolation feature including: a semiconductor substrate, a polish stop layer formed over the semiconductor substrate and a shallow trench layer formed through a portion of the polish stop layer and a portion of the semiconductor substrate, wherein a surface of the shallow trench layer and a surface of the polish stop layer are co-planar.

According to another aspect of the invention, the invention is a semiconductor device including: a transistor formed on a semiconductor substrate and at least one shallow trench isolation feature including, a polish stop layer formed over the semiconductor substrate, a shallow trench layer formed through a portion of the polish stop layer and a portion of the semiconductor substrate, wherein a surface of the shallow trench layer and a surface of the polish stop layer are co-planar.

Figure 1:
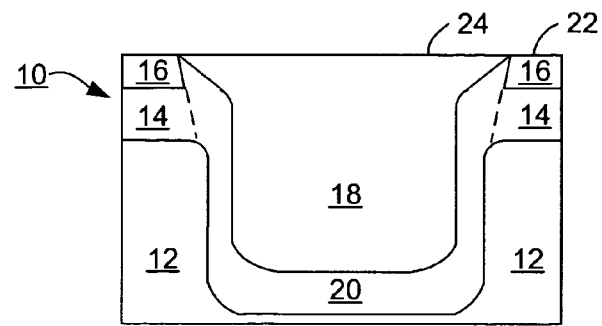
FIG. 1 is a schematic cross-sectional view of a semiconductor substrate including an STI feature that includes an STI polish stop layer for reduced topography in accordance with the present invention.

In the detailed description that follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

Furthermore, it should be appreciated that the process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention.

DETAILED DESCRIPTION

With reference to FIG. 1, an STI feature of the present invention is shown generally designated as 10. The STI feature 10 includes a semiconductor substrate 12 having a barrier layer 14 formed thereon. A polish stop layer 16 is formed over the barrier layer 14. An STI layer 18 (trench oxide) is formed through a portion of the polish stop layer 16, a portion of the barrier layer 14 and a portion of the semiconductor substrate 12. A liner layer 20 is interposed between the STI layer 18 and the semiconductor substrate 12 and the layers formed thereon, i.e., the barrier layer 14 and the polish stop layer 16. A surface 22 of the polish stop layer 16 and a surface 24 of the STI layer 18 are co-planer. Layers of materials used in the fabrication of semiconductor devices may be formed over the co-planar surfaces and benefit therefrom. Further, semiconductor devices that are known in the art such as a field effect transistor (FET) may be formed on, in or over the substrate 12 between such STI features 10.

Figure 9:
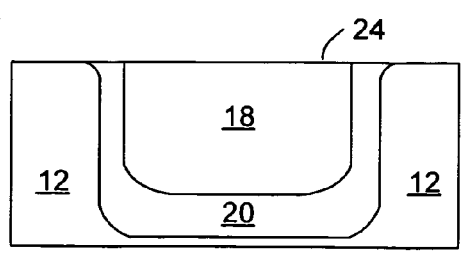
FIG. 9 is a schematic cross-sectional view of a semiconductor substrate including an STI feature that uses an STI polish stop layer for reduced topography in accordance with another embodiment of the present invention.

The polish stop layer 16 may be made of polysilicon, silicon carbide or the like, for example. The polish stop layer 16 is used in a subsequent process step to produce the co-planar surfaces 22 and 24. In an exemplary embodiment, the polish stop layer 16 is made of polysilicon. The exemplary polish stop layer 16 may have a thickness of between 50 and 250 angstroms (Å). In an embodiment where the polish stop layer 16 is made of polysilicon, the polish stop layer 16 or a portion thereof may be converted to $SiO_2$ by an oxidation process and subsequently removed (as illustrated in FIG. 9), as understood by those having ordinary skill in the art. In an embodiment where the polish stop layer 16 is made of silicon carbide, the silicon carbide may provide increased polish selectively relative to a polish stop layer 16 of polysilicon.

Although the polish stop layer 16 is shown as one layer, it should be understood that the polish stop layer 16 may have more layers. In one embodiment, the polish stop layer 16 has at least two layers. The top layer is either a polysilicon or a silicon carbide.

The STI layer 18 may be made of suitable dielectric materials, for example, $SiO_2$ or a dielectric material having a dielectric constant greater than $SiO_2$ (K=3.9). In this exemplary embodiment, the STI layer 18 is made of an oxide, i.e., $SiO_2$. The STI layer 18 may have a thickness of between 500 angstroms and 5000 angstroms, for example.

The liner layer 20 is made of a thermally grown field oxide, i.e., $SiO_2$. The liner layer 20 may have a thickness of between 100 angstroms and 200 angstroms, for example. In an embodiment, the liner layer 20 is formed between the STI layer 18 and the semiconductor substrate 12. In an embodiment not including a barrier layer 14, the liner layer 20 is formed between the STI layer 18 and the semiconductor substrate 12 and the layer formed thereon, i.e., the polish stop layer 16. In an embodiment including a barrier layer 14 and a polish stop layer of silicon carbide, the liner layer 20 is formed between the STI layer 18 and the semiconductor substrate 12 and the barrier layer 14 only.

The barrier layer 14 interposed between the polish stop layer 16 and the semiconductor substrate 12 is illustrated in FIG. 1 as a single layer dielectric. However, the barrier layer 14 could be a multi-layer dielectric. The barrier layer 14 may be made of suitable gate dielectric materials, for example, $SiO_2$ or a gate dielectric material having a dielectric constant greater than $SiO_2$ (K=3.9). In this exemplary embodiment, the barrier layer 14 is made of $SiO_2$. The barrier layer 14 may have a thickness of between 400 and 1000 angstroms (Å), for example.

In one embodiment, the semiconductor substrate 12 is a bulk silicon semiconductor substrate. In one embodiment, the semiconductor substrate 12 is a silicon-on-insulator semiconductor substrate. In another embodiment, the semiconductor substrate 12 is a p-doped silicon semiconductor substrate. Suitable semiconductor substrates include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention is not limited to any particular type of semiconductor substrate.

The polish stop layer 16 is used during a chemical mechanical polishing (CMP) process step to signal when to stop the CMP process. The CMP process step planarizes the surface 22 of the polish stop layer 16 and the surface 24 of the STI layer 18 such that the surfaces are substantially co-planer. Accordingly, the variation in thickness of the surface topography of the substrate 12 is significantly reduced. The reduction in the thickness variation in the surface topography from the formation of STI feature provides advantages such as the formation of subsequent layers with reduced thickness variations in surface topography. The subsequent layers may include photoresist layers, device layers, ARC layers or the like. Reduced surface topography thickness variations in a photoresist layer increases the ability to form semiconductor device features with precision. Reduced thickness variations in device layers may ensure the device operates in accordance with design specifications. As a result, the number of devices produced from a single wafer may be increased. Reduced thickness variations in an ARC layer significantly increases the protective characteristics of the ARC layer. This results in a significant amount of time, money and labor being saved to overcome these problems.

Thus, the use of the polish stop layer 16 improves device performance, reduces processing steps and provides financial benefits. The use of polysilicon as the polish stop layer 16 provides the additional benefit of converting to an oxide during an STI oxidation step. Further, the conversion of a polysilicon polish stop layer to an oxide eliminates the need for a separate polish stop layer removal step.

Not shown in FIG. 1 are additional parts of a working semiconductor device, such as a charge trapping dielectric flash memory cell, suitable for use in a dual-bit EEPROM device, such as the MIRRORBIT™ available from AMD, a SONOS-type FLASH memory cell, a FET, a FLASH memory cell, an EEPROM FLASH memory cell, electrical conductors, protective coatings and other parts of the structure which would be included in a complete, working semiconductor device. These additional parts are not necessary to the present invention, and for simplicity and brevity are neither shown nor described. Nevertheless, how such parts could be added will be easily understood by those of skill in the art.

The method of making the STI feature 10 having a polish stop layer 16 is now described in detail with reference to FIGS. 2–8. FIG. 8 is a flow diagram 50 schematically presenting the steps of making the STI feature 10 of the present invention.

Figure 2:
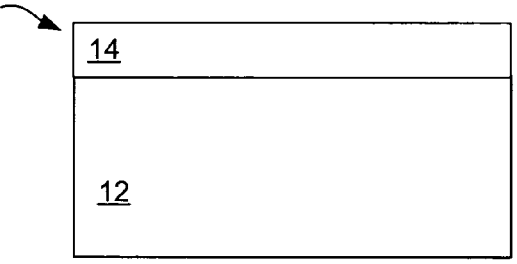
FIGS. 2, 3, 4, 5, 6 and 7 are schematic cross-sectional views of the semiconductor substrate including an STI feature that includes the STI polish stop layer for reduced topography at intermediate stages of manufacture in accordance with the present invention.

In the first step of the method of the present invention, shown in FIG. 8 as Step S52, the semiconductor substrate 12 is provided. The semiconductor substrate 12 is shown in FIG. 2, for example. The semiconductor substrate 12 may be any appropriately selected semiconductor substrate known in the art, as described above. The semiconductor substrate 12 may be subjected to implants to provide an active layer (not shown) in the semiconductor substrate 12 as is known in the art. For instance, boron or indium may be implanted to form a p-type region or channel for an n-type device and phosphorous or arsenic may be implanted to form an n-type region or channel for a p-type device. An exemplary range of concentration of these dopings is between $1 \times 10^{18}$ and $5 \times 10^{18}$ atoms/cm$^3$ for a p-type channel.

Next, the barrier layer 14 is formed on the semiconductor substrate 12. The barrier layer 14 is formed of a dielectric material, for example, SiO$_2$. The barrier layer 14 of SiO$_2$ may be deposited to a thickness between 400 and 1000 angstroms (Å). Alternatively, the barrier layer 14 may be grown by a thermal oxidation process. The resulting structure is shown in FIG. 2.

Figure 3:
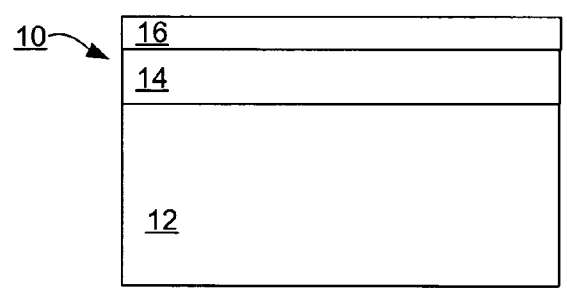

Next in Step S54 and with reference to FIG. 3, the polish stop layer 16 is formed on the barrier layer 14. An undoped layer of polysilicon may be deposited on the barrier layer 14 to form the polish stop layer 16. The undoped polysilicon layer may be deposited to between about 75 and 275 angstroms (Å) thick. Following the deposition of the polysilicon layer, it may be polished back to a thickness of between 50 and 250 angstroms (Å) thick.

In one embodiment, the polish stop layer 16 is deposited by chemical vapor deposition (CVD). The CVD method may be any appropriate CVD method known in the art. For example, the CVD method may be ALD, PECVD, RTCVD or LPCVD.

Figure 4:
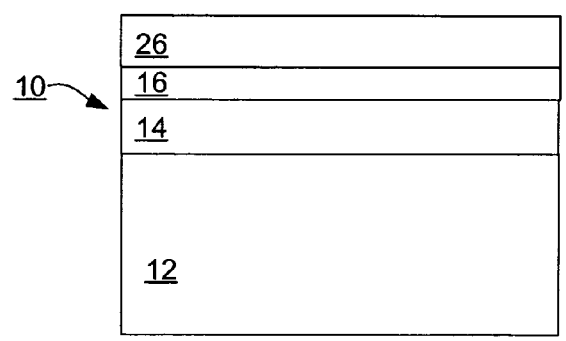

With reference to FIG. 4, the oxidation barrier layer 26 is formed over the polish stop layer 16. The oxidation barrier layer 26 is formed of a nitride containing dielectric material. The oxidation barrier layer 26 may be made of a Si$_3$N$_4$ material, for example. The oxidation barrier layer 26 may be formed by a nitridation process as described below. The liner layer 26 may have a thickness of between 200 and 400 angstroms (Å), for example. The oxidation barrier layer 26 is used to inhibit oxidation of the substrate during oxidation steps.

To deposit the oxidation barrier layer 26, nitride in the form of ammonia gas, NH$_3$ and saline gas are supplied to a CVD apparatus. When a suitable thickness of silicon nitride is deposited, the flow of the NH$_3$ gas is stopped. Depositing nitride using conventional RTA techniques may also form the thin oxidation barrier layer 26 of nitride.

Next, a photoresist layer (not shown) is formed over the oxidation barrier layer 26. The photoresist layer is formed by a spin on coating process and patterned by a photolithography process to form an STI mask as is known by those having ordinary skill in the art. The photorsist layer may have a thickness of between 200 and 400 angstroms (Å), for example.

Figure 5:
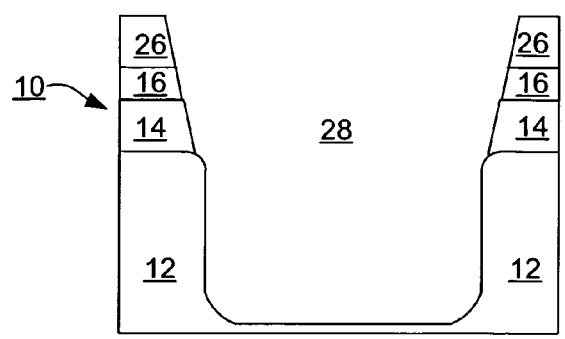

Now referring to FIG. 5 and Step S58, the semiconductor structure is etched with one or more suitable etchants. In an embodiment, an etchant species is selected for each material to be etched. In an embodiment, an etchant species is selected to etch the oxidation barrier layer 26 and another etchant species is selected to etch the polish stop layer 16. Further, an etchant species is selected to etch the semiconductor substrate 12. Thus, the semiconductor structure is etched down through a portion of the oxidation barrier layer 26, a portion of the polish stop layer 16 and a portion of the semiconductor substrate 12, leaving a shallow trench 28.

Figure 6:
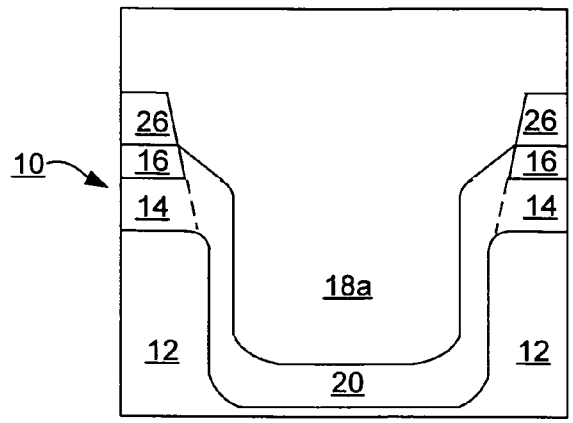

Next in Step S60 and with reference to FIG. 6, an oxidation process is performed. The oxidation process may be a thermal oxidation process. The thermal oxidation process grows the liner layer 20 (field oxide) from the exposed surface of the semiconductor substrate 12. The liner layer 20 may be formed to a thickness between about 100 angstroms and 200 angstroms (Å) thick.

Next in Step S61, a LPCVD or a HDP process is performed to deposit oxide in the shallow trench 28. To deposit the STI layer 18, oxygen and saline gas are supplied to a CVD apparatus. When a suitable thickness of oxide is deposited, the flow of oxygen is stopped. Alternatively, TEOS may be used in an LPCVD process as is known by those having ordinary skill in the art. The STI layer 18a may be formed to a thickness between about 500 angstroms and 5000 angstroms (Å) thick. As a result, the liner layer 20 is interposed between the STI layer 18a (trench oxide) and the semiconductor substrate 12 and the layers formed thereon, i.e., the barrier layer 14 and the polish stop layer 16. Following the formation of the STI layer 18a, it may be planarized, i.e., polished back to be co-planar with a surface 22 of the polish stop layer 16.

The thickness of the STI layer 18a is determined by the thickness variation in the topography of the surface of the semiconductor structure shown in FIG. 5. Typically, for very large scale integrated circuit fabrication, the thickness of the STI layer 18a is in a range of about 50 nm to about 500 nm. Alternatively, the thickness may be in a range of about 100 nm to about 400 nm. Further still, the thickness may be in a range of about 200 nm to about 300 nm. It should be understood by those having ordinary skill in the art that the above thicknesses are merely exemplary and that the thicknesses may be combined, for example, from about 50 nm to about 400 nm, or about 100 nm to about 300 nm, or about 50 nm to about 100 nm or the like.

The lower limit for the thickness of the STI layer 18a is dictated by the requirements of good step coverage associated with the vertical wall profile of the trench 28 in the semiconductor structure shown in FIG. 5. The upper limit for the thickness of the STI layer 18a is determined by the CMP species to be used to planarize the surface 24 of the STI layer 18a with the surface 22 of the polish stop layer 16.

In a seventh step of the process in accordance with the present invention, shown schematically in FIG. 8 as Step S62 and illustrated in FIG. 1, the STI layer 18a is etched or polished using, for example, a chemical mechanical polishing (CMP) to remove the STI layer 18a and the oxidation barrier layer 26 from the horizontal surfaces of the polish stop layer 16. Thus, unetched portions 18 of the STI layer 18a are left in the trench 28. Thus, the formation of the STI feature 10 by the above describe process significantly reduces the thickness variations in the surface of the semiconductor structure.

Figure 7:
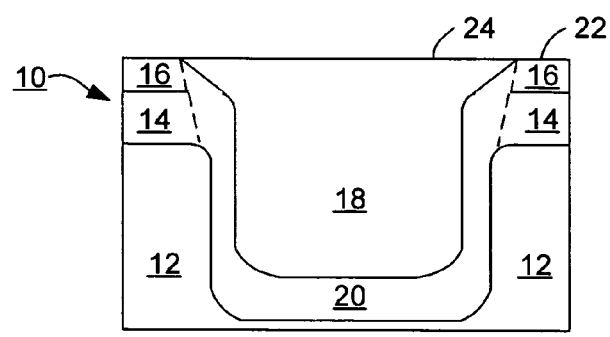
Figure 8:
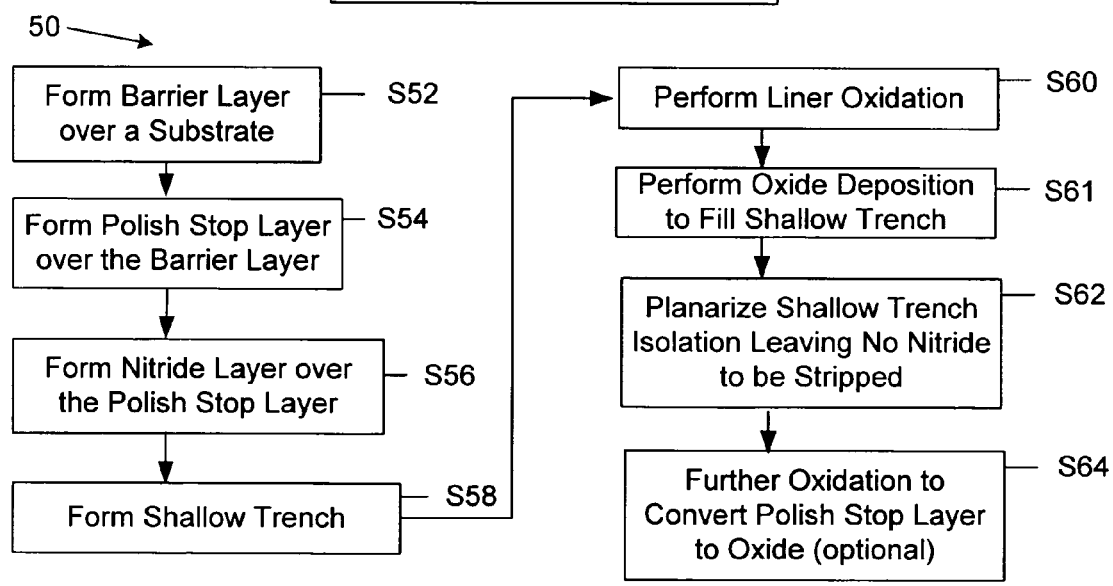
FIG. 8 is a schematic flow diagram showing the basic steps in a process of making the substrate including an STI polish stop layer for reduced topography in accordance with the present invention.

In an optional eighth step of the process in accordance with the present invention, shown schematically in FIG. 8 as step S64 and illustrated in FIG. 7, the polish stop layer 16 is converted to silicon dioxide. A thermal oxidation process is used to grow or convert the polysilicon polish stop layer 16 to a dielectric material, for example, silicon dioxide. The converted polish stop layer 16 may now be removed with barrier layer 14 in a single step.

After the formation of the STI feature 10, semiconductor devices may be formed on the semiconductor structure by depositing and etching subsequent layers that will benefit from the reduction in the variations in the topography. Subsequently, connections such as word lines may be formed using conventional techniques in order to establish electrical connections between the semiconductor device and other nodes (such as an I/O pad or Vss), the source or the drain of the device, as well as, a power supply or a ground, if desired. The formation of the connections is not shown.

INDUSTRIAL APPLICABILITY

The present invention, by providing an STI feature including a surface that is co-planar with an adjacent surface, reduces thickness variations in the surface topography of a semiconductor substrate that provides advantages. For example, layers formed subsequently may include reduced thickness variations in surface topography. The subsequent layers may include photoresist layers, device layers, ARC layers or the like. Reduced surface topography thickness variations in a photoresist layer increases the precision of features formed thereby. Reduced thickness variations in device layers may increase the operation of the device. As a result, the number of devices produced from a single wafer may be increase. Reduced thickness variations in an ARC layer significantly increases the characteristics of the ARC layer. As a result, thinner ARC layers that provide the same level of protection may be formed. The use of polysilicon as the polish stop layer 16 provides the additional benefit of converting to an oxide during an STI oxidation step and eliminates the need for a separate polish stop layer removal step. This results in a significant amount of time, money and labor being saved. Thus, the use of the polish stop layer 16 improves device performance, reduces processing steps and provides financial benefits.

Although particular embodiments of the invention have been described in detail, it is understood that the invention is not limited correspondingly in scope, but includes all changes, modifications and equivalents coming within the spirit and terms of the claims appended hereto. Additionally, although the flow diagram of FIG. 8 shows a specific procedural order, it is understood that the procedural order may differ from that which is depicted. For example, the procedural order of two or more blocks may be reordered relative to the order shown. Also, two or more blocks shown in succession in FIG. 8 may be processed concurrently or with partial concurrence.

Furthermore, the present invention was described above in terms of an STI feature formed on a semiconductor substrate. However, the present invention is not limited to this illustrative embodiment. The present invention may be applied to any semiconductor feature in which a planarized surface is desired. For example, the present invention may be used with a contact. Alternatively, the present invention may be used with an electrode. Thus, it is to be understood that the present invention is not limited to the specific illustrative embodiments described below.

What is claimed is:

1. A method of fabricating a shallow trench isolation feature comprising the steps of:
   providing a semiconductor substrate;
   forming a polysilicon polish stop layer over the semiconductor substrate;
   forming a nitride containing layer over the polish stop layer;
   forming a shallow trench layer through a portion of the nitride containing layer, a portion of the polish stop layer and a portion of the semiconductor substrate;
   removing the nitride containing layer by a chemical mechanical polishing process;
   planarizing the shallow trench layer and the polish stop layer until a surface of the shallow trench layer and a surface of the polish stop layer are co-planar; and
   after planarizing, oxidizing substantially all of the polish stop layer to convert the polish stop layer to a field oxide layer.

2. A method according to claim 1, including the step of:
   forming a barrier layer over the semiconductor substrate.

3. A method according to claim 1, including the step of:
   etching an aperture through the nitride containing layer to expose a portion of the polish stop layer.

4. A method according to claim 1, wherein forming the shallow trench layer includes:
   forming a shallow trench through a portion of the polish stop layer and a portion of the semiconductor substrate; and
   depositing an oxide in the shallow trench to form the shallow trench layer.

5. A method according to claim 3, wherein the nitride containing layer is at least one of $Si_3N_4$ or $SiO_xN_y$.

6. A method according to claim 1, including the step of:
   forming a liner layer interposed between the shallow trench layer and the semiconductor substrate.

7. The method of claim 1, further comprising removing the field oxide layer, wherein removing the field oxide layer includes removing a portion of the shallow trench layer so that a resulting upper surface of the shallow trench layer is co-planar with an upper surface of the semiconductor substrate.

8. The method of claim 7, wherein removing the field oxide layer includes removing a barrier layer formed between the semiconductor substrate and the polish stop layer.

9. A method of fabricating a shallow trench isolation feature comprising the steps of:
   providing a semiconductor substrate;
   forming a silicon carbide polish stop layer over the semiconductor substrate;
   forming a nitride containing layer over the polish stop layer;
   forming a shallow trench layer through a portion of the nitride containing layer, a portion of the polish stop layer and a portion of the semiconductor substrate;
   removing the nitride containing layer by a chemical mechanical polishing process; and
   planarizing the shallow trench layer and the polish stop layer until a surface of the shallow trench layer and a surface of the polish stop layer are co-planar.

10. The method according to claim 9, further comprising forming a barrier layer between the semiconductor substrate and the polish stop layer.

11. The method according to claim 9, further comprising etching an aperture through the nitride containing layer to expose a portion of the polish stop layer.

12. The method according to claim 9, wherein forming the shallow trench layer includes:
   forming a shallow trench through a portion of the polish stop layer and a portion of the semiconductor substrate; and
   depositing an oxide in the shallow trench to form the shallow trench layer.

13. The method according to claim 9, wherein the nitride containing layer is at least one of $Si_3N_4$ or $SiO_xN_y$.

14. The method according to claim 9, further comprising forming a liner layer interposed between the shallow trench layer and the semiconductor substrate.

* * * * *